United States Patent [19]
Pant et al.

[11] Patent Number: 5,247,278
[45] Date of Patent: Sep. 21, 1993

[54] MAGNETIC FIELD SENSING DEVICE

[75] Inventors: Bharat B. Pant, St. Louis Park; Donald R. Krahn, Eagan; Richard B. Fryer, Minnetonka, all of Minn.

[73] Assignee: Honeywell Inc., Minneapolis, Minn.

[21] Appl. No.: 797,872

[22] Filed: Nov. 26, 1991

[51] Int. Cl.$^5$ ............................................. H01L 43/00
[52] U.S. Cl. ................................... 338/32 R; 324/252
[58] Field of Search ........................... 338/32 R, 32 H; 324/207.21, 207.2, 249, 251, 252, 260; 335/296, 302, 304, 306

[56] References Cited

U.S. PATENT DOCUMENTS

| | | |
|---|---|---|
| 3,902,167 | 8/1975 | Lutes et al. . |
| 4,296,377 | 10/1981 | Ohkubo . |
| 4,492,922 | 1/1985 | Ohkubo .................... 338/22 R X |
| 4,525,671 | 6/1985 | Sanson ........................ 324/252 |
| 4,533,872 | 8/1985 | Boord et al. . |
| 4,780,848 | 10/1988 | Daughton et al. . |
| 4,823,075 | 4/1989 | Alley . |
| 4,829,277 | 5/1989 | Stahura et al. .............. 335/306 |
| 4,847,584 | 7/1989 | Pant . |

FOREIGN PATENT DOCUMENTS 2202635 9/1988 United Kingdom .

OTHER PUBLICATIONS

Japanese Patent Bureau Laid Open Patent Bulletin Sho 57-48284 Mar. 19, 1982.
Philips Technical Publication 268 Philips Components May 1990.
Magnetoresistive Sensors, Bharat P. Pant, Scientific Honeyweller, Fall 1987.
Magnetic Sensors, James E. Lenz, Scientific Honeyweller Apr. 1985.
Development of Magentic Thin Film Sensors, James, Holmen, Scientific Honeyweller Jun. 1982.
Thin Film Magnetic Sensors, R. B. Fryer, Scientific Honeyweller Jun. 1982.
Properties of Thin Film Magnetoresistive Films, Scientific Honeyweller Jun. 1982.

Primary Examiner—Marvin M. Lateef
Attorney, Agent, or Firm—Gregory A. Bruns

[57] ABSTRACT

A self-contained magnetic field sensing device which has magnetic field sensing elements arranged in an electrical bridge network. An integral electrical conductor spaced from the sensing elements carries a current for setting and resetting the direction of magnetization of the sensing elements. A known magnetic field useful for test set up and calibration is provided at the sensing elements by a second integral electrical conductor.

20 Claims, 6 Drawing Sheets

MAGNETIC FIELD SENSING DEVICE

BACKGROUND OF THE INVENTION

The invention relates in general to magnetic field sensors and more particularly to magnetic field sensors requiring the use of a magnetic field for functions such as domain setting, calibration, establishing a bias or offset magnetic field, determining a sensor transfer characteristic, or other functions requiring a magnetic field.

The invention has application to a variety of magnetic sensors or transducers. These include, but are not limited to magnetoresistive transducers, magnetodiodes, magnetotransistors and Hall effect transducers.

The domain setting function is important for magnetoresistive transducers. Magnetoresistive transducers are typically defined on a layer above the integrated circuit wafer or on a glass slide. Magnetoresistive transducers are composed of long thin strips of a magnetoresistive film such as permalloy. With a current running along the length of the film, the magnetization of the film generally forms an angle with the current, and the resistance of the film depends on this angle. When the magnetization of the film is parallel to the current, the resistance is at a maximum, and when it is perpendicular to the current, the resistance has its minimum value.

The magnetization in these films must be set in a single domain state before it is ready to sense magnetic fields. Although there may be situations where a magnetoresistive transducer can sense magnetic fields even if it is in a multiple domain state, for purposes of repeatability, it is essential that the magnetization of a magnetoresistive transducer magnetic sensing element be in a single domain state. In certain designs of transducers, this domain setting can be done using a large external field. However, this setting approach is not practical when the magnetoresistive transducer has already been packaged in a system. In addition, in many situations there are several transducers within one package with different transducers requiring setting in different directions. While one potential solution is to wrap individual coils around each transducer; the use of individual coils is expensive and it is difficult to generate large fields by using small coils. Another situation frequently arising is when different legs of a bridge circuit, for example a Wheatstone bridge circuit fabricated on a single chip, have to have their magnetization set in different directions.

The testing, setup, or calibration of magnetic field sensing devices represents a second important area. The function needed is the ability to produce a known magnetic field at the magnetic field sensor. This known field and the ability to vary the field allows one to measure the response of the magnetic field sensor and perform set up, sensitivity and calibration operations. In the past these operations have been performed by producing the known magnetic field by using a pair of Helmholtz coils or a solenoid coil. These methods require the use of external field producing coils and cannot be used when multiple magnetic field sensors have been placed in a single package. In addition, the external coil approach does not permit the magnetic field sensor to be tested and calibrated in its working environment.

Thus a need exists for a simple self contained device to provide a magnetic field for setting and resetting the magnetic domains in a sensor and for producing a known magnetic field for testing, set up, and calibration of a magnetic field sensor.

SUMMARY

The present invention solves these and other needs by providing in a first aspect, a device for setting and resetting the magnetic domains in magnetoresistive magnetic field sensing elements arranged in an electrical bridge network. A current strap is provided for setting the directions of magnetization in opposing bridge elements in the same direction or in opposite directions depending on the particular design.

In another aspect of the present invention, a second current strap produces a known magnetic field at the magnetic field sensing elements. The known magnetic field is used for functions such as testing, set up, and calibration.

The present invention provides both a setting and resetting feature and the independent feature of producing a known magnetic field at the magnetic sensing elements. The presence of both of these features in a magnetic field sensor increases the sensor functionality far beyond the sum of the individual functions of the two features.

DESCRIPTION OF THE PREFERRED EMBODIMENT

Figure 1:
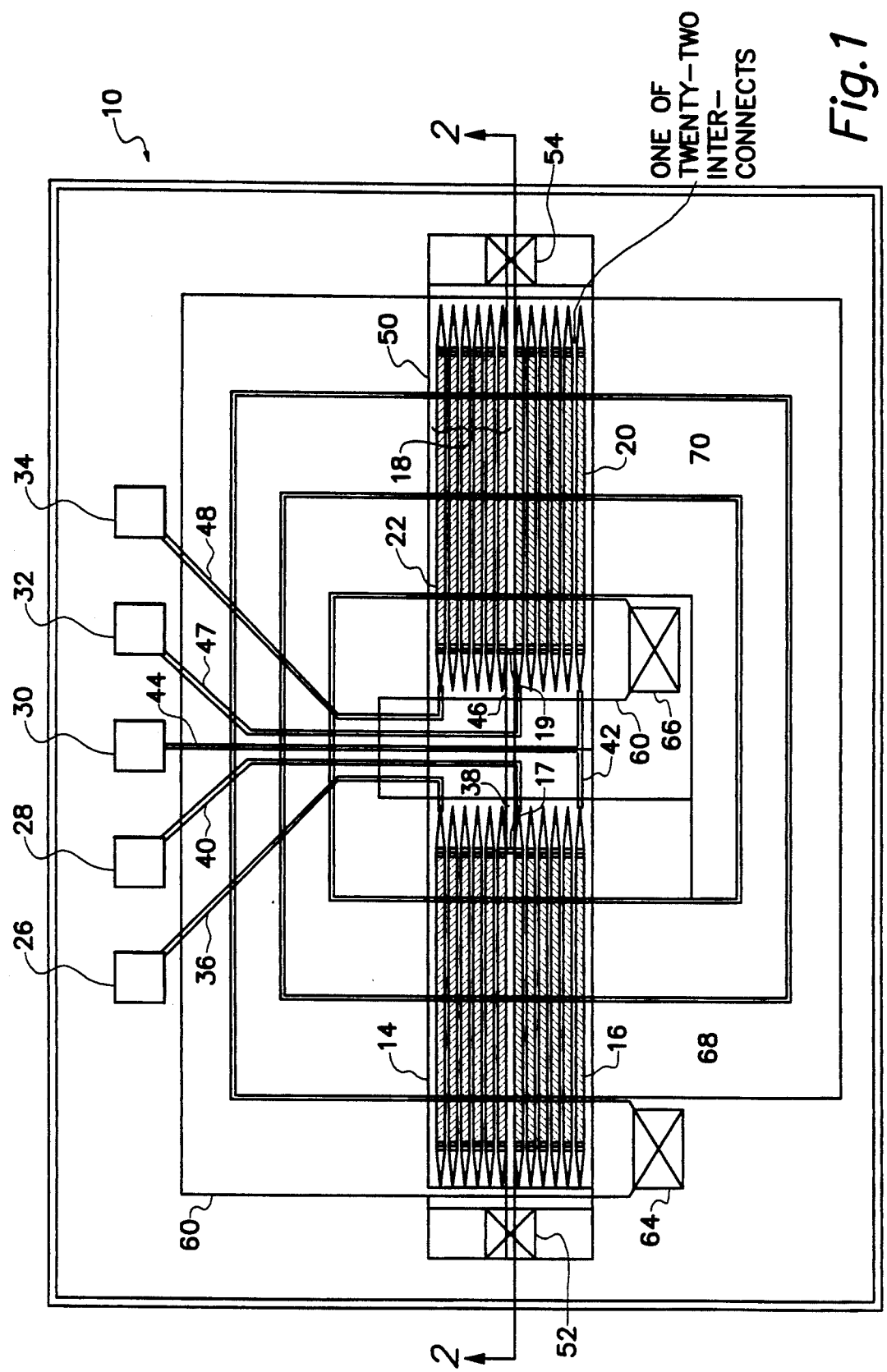
FIG. 1 shows a layout for a magnetic field sensing device according to the teachings of the present invention.

A device for sensing magnetic field in accordance with the present invention is shown in the drawings and generally designated 10. FIG. 1 shows an integrated circuit layout for a magnetic field sensor in accordance with the present invention. Magnetic field sensor 10 is formed on a semiconductor substrate 12 using integrated circuit techniques. Four magnetoresistive elements 14, 16, 18, and 20 which utilize "barber pole" biasing are arranged in a Wheatstone bridge configuration. Each of magnetoresistive elements 14, 16, 18, and 20 is an array of six parallel positioned magnetoresistive strips 22 electrically connected in series with one another. Substrate 12 has an insulating layer 24, typically of silicon dioxide and/or silicon nitride. Background information on magnetoresistive sensors and the details of the formation of parallel positioned magnetic strips 22 on substrate 12 to provide magnetoresistive elements 14, 16, 18 and 20 are described in U.S. Pat. No. 4,847,584 dated Jul. 11, 1989 to Bharat B. Pant and assigned to the same assignee as the present application. U.S. Pat. 4,847,584 is hereby incorporated by reference.

Magnetoresistive elements 14, 16, 18, and 20 are interconnected and connected to pads 26, 28, 30, 32, and 34 as follows. Pad 26 is connected by conductor 36 to element 14 and element 14 is connected to element 16 at 38. Conductor 40 makes connection 38 available at pad 28. Element 16 is connected by conductor 42 to element 20 and conductor 44 makes connection 42 available at pad 30. Element 20 is interconnected to element 18 at 46 and conductor 47 makes connection 46 available at pad 32. Pad 34 is connected to element 18 by conductor 48.

Figure 3:
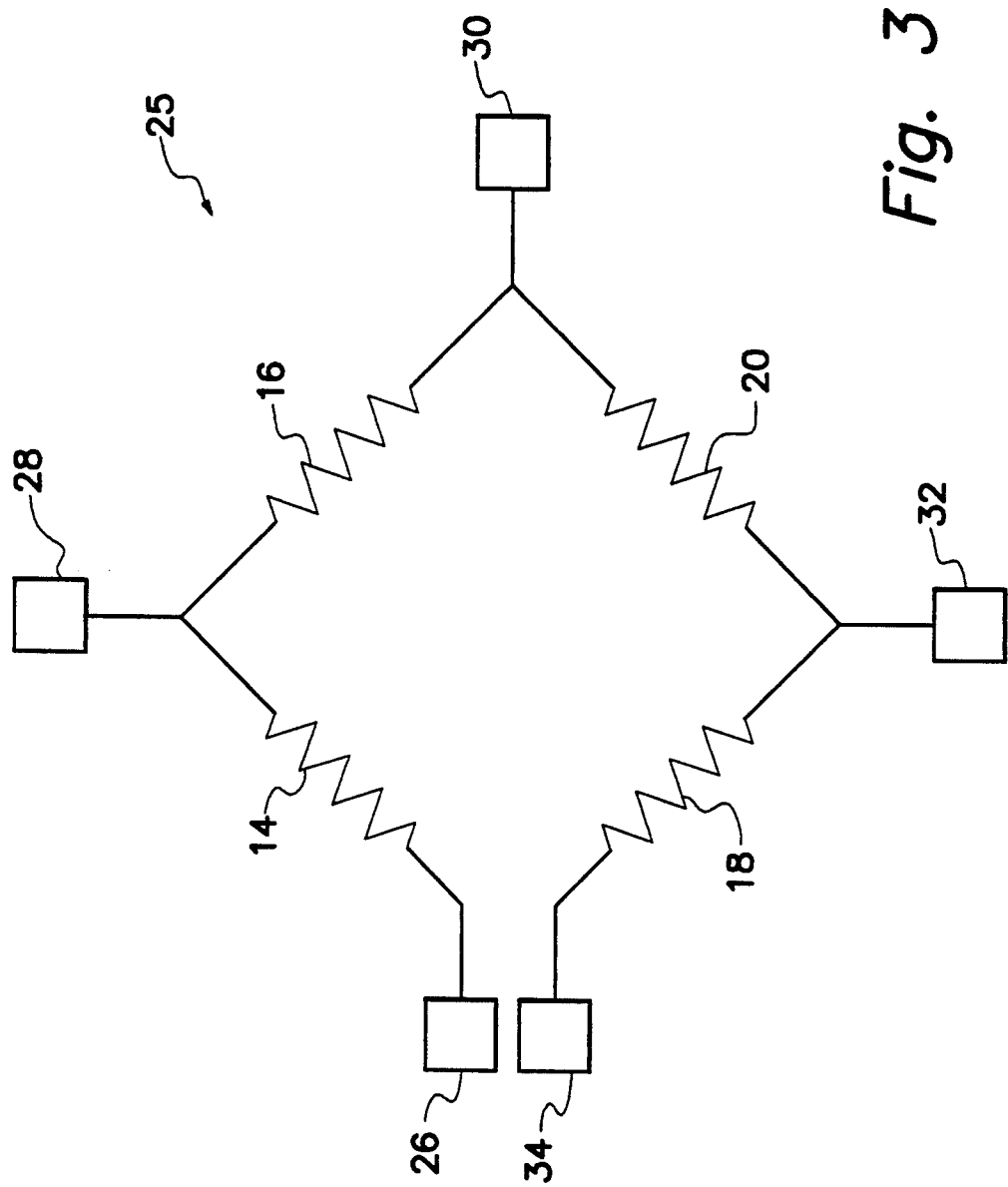
FIG. 3 is an electrical schematic diagram of the equivalent circuit of the structure of the magnetoresistive magnetic field sensing elements shown in FIG. 1.

The effective electrical network formed by the structure shown in FIG. 1 may be more easily visualized by reference to FIG. 3 which is an electrical schematic of a Wheatstone bridge 25 formed by magnetoresistive elements 14, 16, 18, and 20 using the same numbering as in FIG. 1. FIG. 3 also shows pads 26, 28, 30, 32 and 34. Bridge 25 is a magnetic field sensor which will be sensitive to magnetic field components in a direction perpendicular to magnetoresistive strips 22. With pad 26 connected to pad 34 and a voltage applied between pad 28 and 32 the output of bridge 25 will be between pads 26 and 30.

Figure 2:
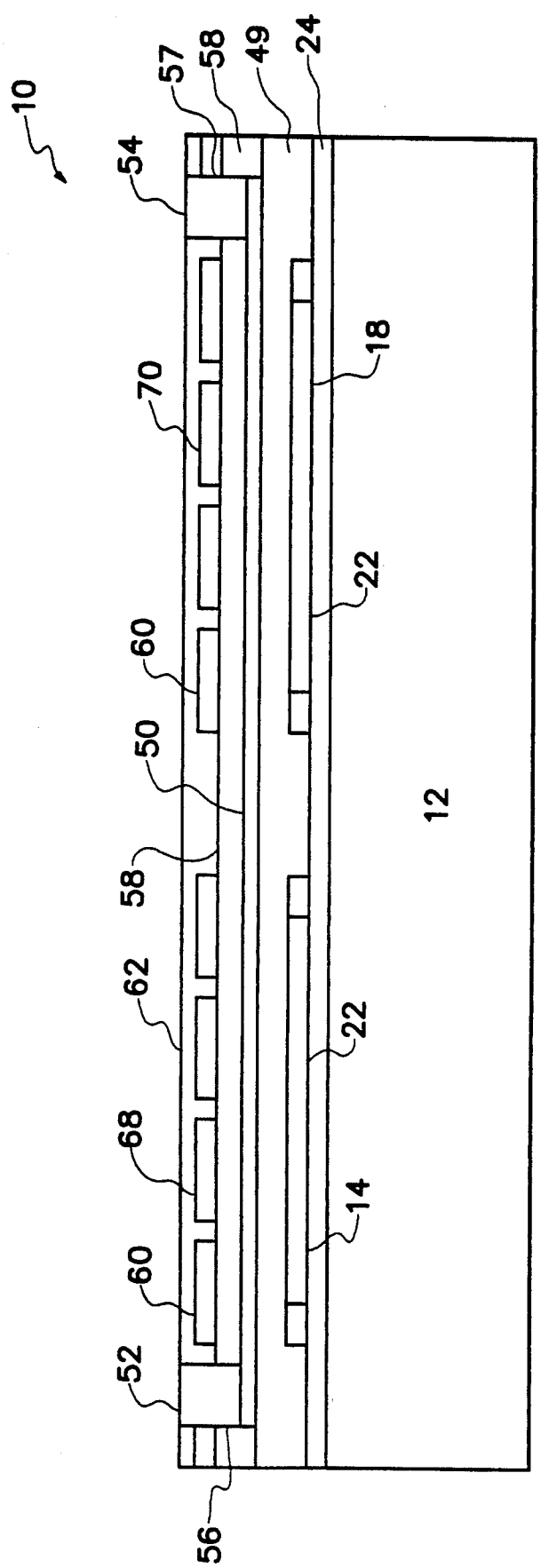
FIG. 2 is a cross-sectional view along sectional line 2—2 of the magnetic field sensing device shown in FIG. 1.

FIG. 2 is a cross-sectional view of magnetic field sensor 10 along section line 2—2 of FIG. 1. A second dielectric 49 covers magnetoresistive elements 14, 16, 18, and 20. An electrical conductor 50 is formed on dielectric 49. Conductor 50 is in the form of a current strap and may be of copper, aluminum or other conducting material. Conductor 50 extends between pad 52 and pad 54 and is located to pass over magnetoresistive elements 14, 16, 18, and 20 in a direction parallel to magnetoresistive strips 22. Dielectric 58 covers conductor 50. Vias 56 and 57 connect pad 52 and pad 54 respectively to conductor 50.

Conductor 60 is located on dielectric 58. Conductor 60 is in the form of a spiral or serpentine current strap extending between pad 64 and pad 66. The serpentine form of conductor 60 extends in a clockwise direction from pad 64 to pad 66. Conductor 60 includes a segment 68 and a segment 70.

Figure 5:
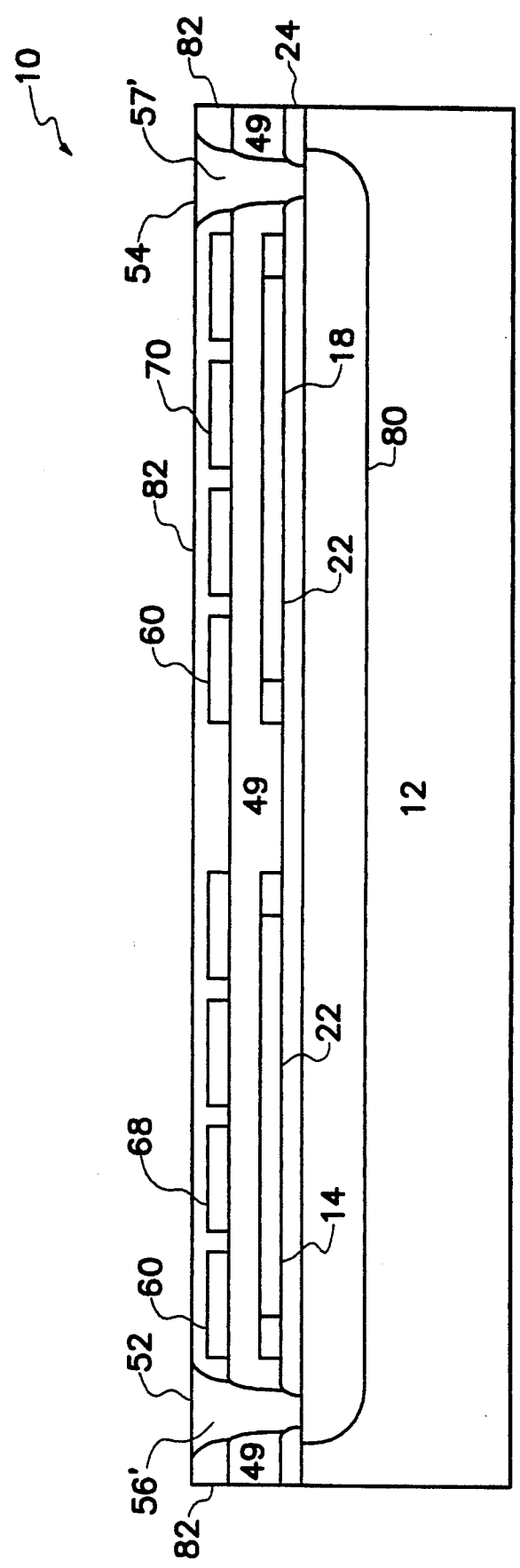
FIG. 5 is a cross-sectional view of a first alternative embodiment of the present invention.

A first alternative embodiment of the present invention is shown in FIG. 5. In this embodiment, implanted layer 80 in substrate 12 extends beneath magnetoresistive elements 14, 16, 18 and 20. Current in implanted layer 80 provides a magnetic field for biasing, offset, calibration or feedback. In this embodiment, pads 52 and 54 are connected to opposite ends of implanted layer 80 by vias 56' and 57' respectively. While this alternative embodiment shows layer 80 used as a conductor to produce a magnetic field for the purpose of calibration, offset or feedback, it can be appreciated that an implanted layer could also produce a magnetic field for the purpose of setting and resetting directions of magnetization.

Figure 6:
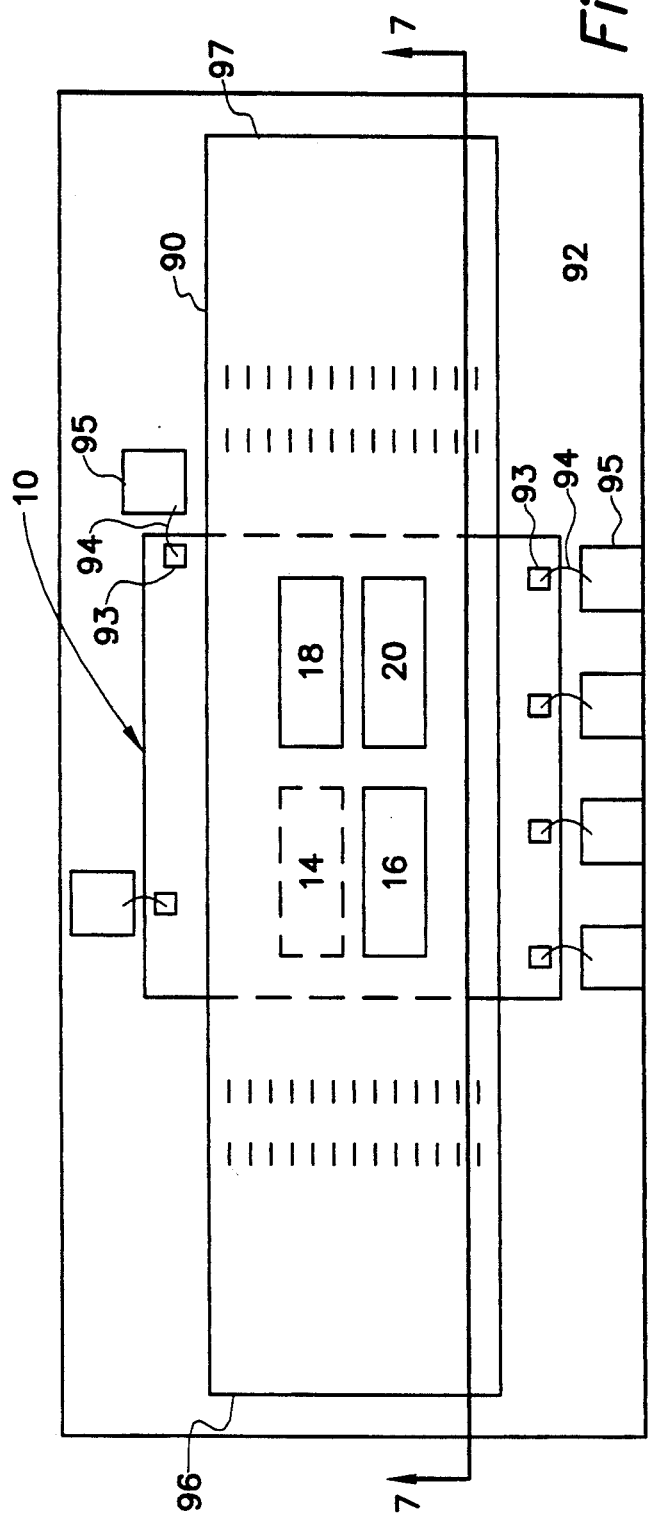
FIG. 6 is a plan view second alternative embodiment of the present invention.
Figure 7:
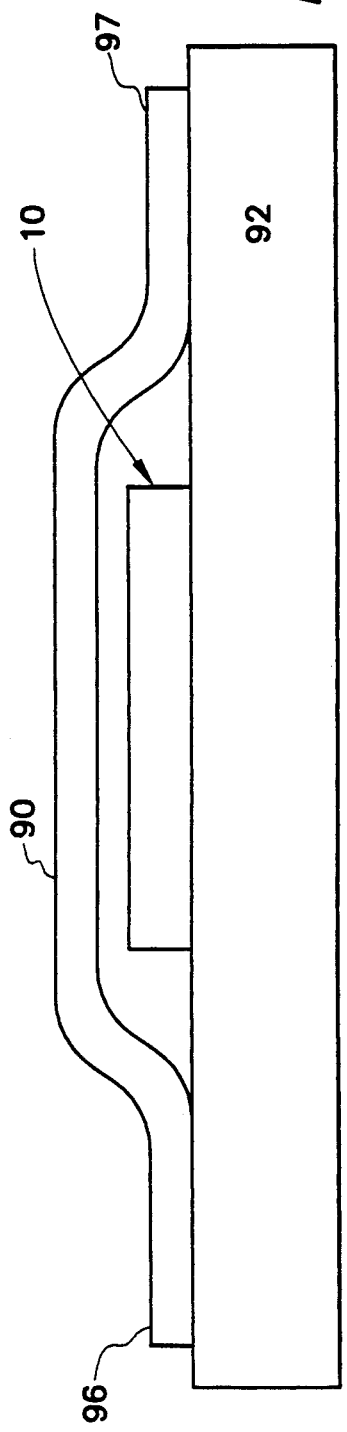
FIG. 7 is a cross-sectional view along section line 7—7 of this device of FIG. 6.

A second alternative embodiment is shown in FIGS. 6 and 7 where a separate conductive strap is placed in the packaging for magnetic field sensing device 10. A ceramic carrier package 92 is shown and packages of other materials could also be used. Device 10 is mounted on carrier 92 and includes pads 93. Wirebonds 94 form connection from pad 93 to pads 95 on carrier 92. A metallic conductor or current strap 90 extends over device 10 and provides a magnetic field for magnetoresistive elements 14, 16, 18 and 20. Current in current strap 90 is supplied to and taken from ends 96 and 97.

Now that the basic construction of magnetic field sensor 10 has been set forth, the method of use and subtle features of device 10 according to the present invention may be described and appreciated.

Locating Conductor 50 on the magnetic sensor chip provides a structure which can be used to produce a known magnetic field, and this structure may be used with any magnetic sensor requiring a magnetic field for purposes such as biasing, offsetting, or calibrating. It may also be used in a feedback application to provide an indication of the feedback current needed to null an external field.

When a current flows from pad 52 through conductor 50 to pad 54 or in the opposite direction, this current produces a magnetic field in a direction perpendicular to magnetoresistive strips 22 or in the direction to which magnetoresistive strips 22 are sensitive. This current then will unbalance bridge 25 and provide an output voltage at pads 26 and 30. Thus when the geometry of device 10 is known, one can determine by calculation what magnetic field is produced at magnetoresistive elements 14, 16, 18, and 20 by a given current in conductor 50. By then passing the given current through conductor 50 and measuring the output voltage at pads 26 and 30, one can determine the relationship between a known input or test magnetic field and the output voltage at pads 26 and 30.

Conductor 50 may also be used to produce a magnetic field at magnetoresistive elements for the purpose of offsetting or balancing out an existing external magnetic field. For example, device 10 may be in a location where a 1.0 gauss external field in one direction is being sensed and it may be desirable to null out or neutralize this external field so device 10 will see essentially a "0" field. A current may then be passed through conductor 50 to produce a 1.0 gauss field in the opposite direction and null out the external field.

In a feedback application conductor 50 can be used to keep device 10 at a "0" output condition. Here a variable current sufficient to oppose the varying external field would be passed through conductor 50. Measurement of the current required in conductor 50 would then be representative of the varying external magnetic field. The electronics required for the feedback circuitry may be placed outside of device 10 or integrated into device 10.

Conductor 50 which may be referred to as a bias strap or calibration strap is illustrated as a thin film conductor. Conductor 50 however may be implemented as a conductor in or on the package for device 10, an implanted layer in the silicon substrate or by using the silicon substrate itself.

When device 10 is to be used in an application requiring an absolute measurement it will be necessary to eliminate the offset due to slightly mismatched magnetoresistive bridge elements, temperature differences in the magnetoresistive bridge elements and drift in the bridge measurement electronics. To illustrate the operation and advantages of set-reset conductor 60 it will be assumed that conductor 60 is to be used as shown in FIGS. 1-2. Conductor 60 provides a set-reset feature. Conductor 60 is in the form of a serpentine or spiral current strap to perform the setting of a direction of magnetization in magnetoresistive elements 14, 16, 18, and 20. In FIG. 1, conductor 60 is arranged to set the magnetization in different directions. In other bridges, conductor 60 could be arranged to set the magnetization in the same direction. With an electrical current entering conductor 60 at pad 64 and leaving at pad 66 it can be appreciated that the current direction in segment 68 of conductor 60 will cause a magnetization of elements 14 and 16 in a direction toward pad 52 while the current direction in segment 70 will cause a magnetization of elements 18 and 20 in a direction toward pad 54. Reversing the direction of magnetization is effected by having the current enter conductor 60 at pad 66 and exit at pad 64. The procedure is to make a first measurement at pads 26 and 30 after a set-reset current pulse which entered at 64 and left at 66, then reverse the direction of current pulse through conductor 60 and make a second measurement at pads 26 and 30. The difference between the first and second measurements is representative of the magnetic field component along the sensitive axis of magnetoresistive elements 14, 16, 18 and 20. Note that the sensitive axis of device 10 is in the plane of the device and perpendicular to the direction of the long permalloy strips. The effect of using the set-reset feature provided by conductor 60 at short time intervals is to eliminate the offset that could otherwise result.

In order to perform the set-reset function, a typical magnetic field of 20 to 100 gauss at magnetoresistive elements 14, 16, 18 and 20 is required. The rapid magnetization dynamics allows the duration of the current in conductor 60 which produces the set-reset field to be very short. Pulses having a duration of less than a microsecond have been found to be satisfactory.

In one test arrangement an aluminum set-reset strap was used having a width of approximately 160 micrometers, a setting current of 500 mA was found to supply approximately a 20 Oersted field to the magnetoresistive strips which constitute the sensing elements.

Conductor 60 may of course be a single full width current strap rather than the segmented strap shown, however the segmented strap can be used to advantage to reduce the current needed to provide the magnetic field under conductor 60.

It will be recognized that various spatial arrangements for magnetoresistive elements 14, 16, 18, and 20 other than shown in the drawings can be devised, and forms for conductor 60 other than the spiral form shown may also be devised.

On application of magnetic field sensor is to determine the orientation of the sensor with respect to the magnetic field of the earth. Electronic compasses offer advantages over conventional compasses which utilize a piece of magnetized metal to indicate direction. One advantage is that an electronic compass may be much smaller in size than a typical magnetized compass. Another advantage is that an electronic compass provides an electronic output allowing a simple interface with other electronic circuitry such as a navigation system. Also, an electronic compass is not affected by acceleration or deceleration of a vehicle in which it is carried.

Figure 4:
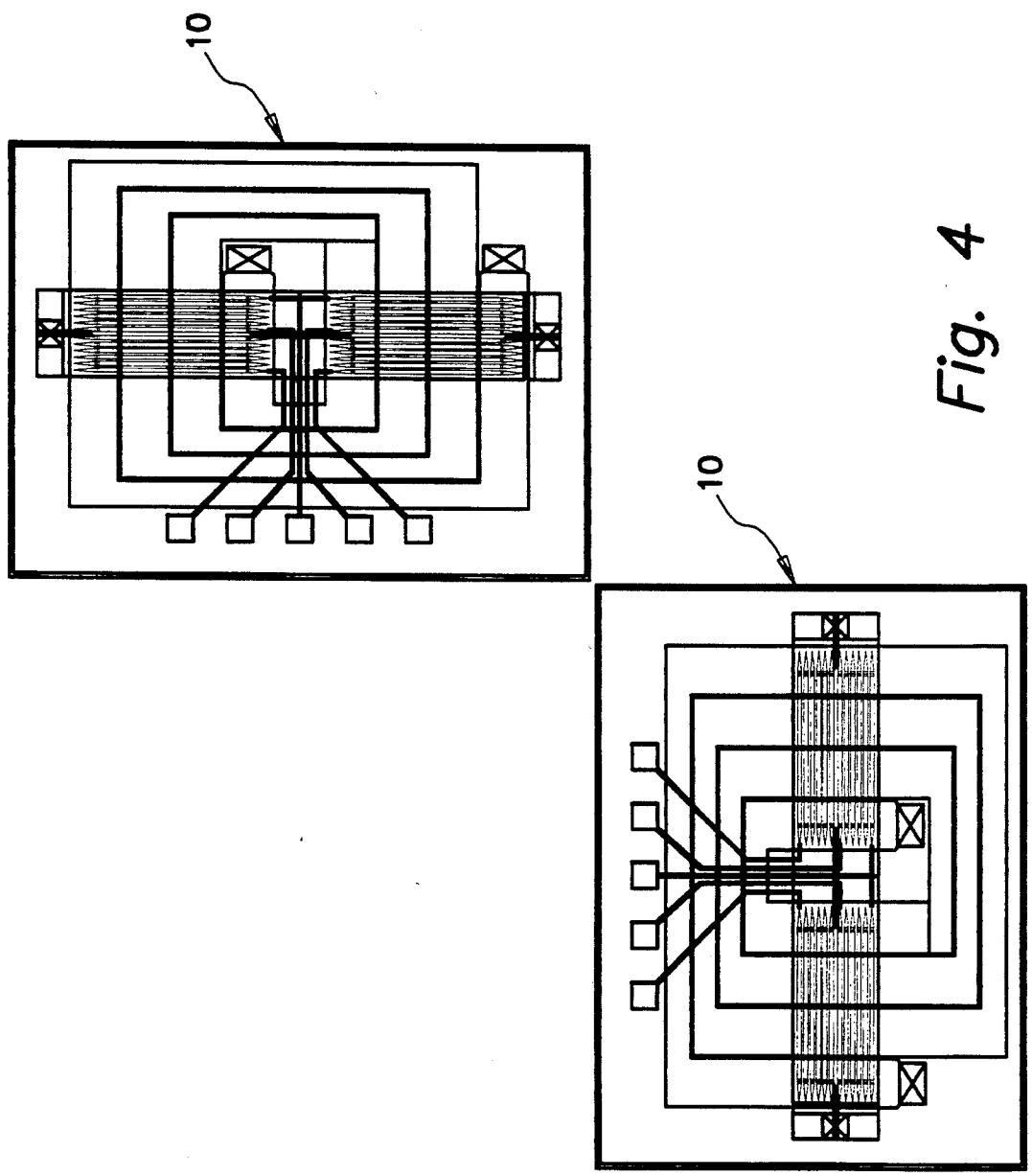
FIG. 4 is a plan view of magnetic field sensing devices for use in an electronic compass application.

An electronic compass may be implemented by utilizing two of the magnetic field sensors described herein as device 10 as shown in FIG. 4. The two devices would be oriented to sense components of the earth's magnetic field that are perpendicular to one another.

In many magnetic field sensing applications, the presence of both set-reset conductor 60 and biasing or calibration conductor 50 in a single self-contained device provides greatly increased functionality at a measurement system level. One example of the usefulness of this arrangement is as follows. An initial measurement using the set-reset feature may be performed to determine the external field. The current necessary to null out the external field may then be determined from the known geometry of device 10 and this current may then be applied to biasing or calibration conductor or strap 60. A second measurement using the set-reset feature may then be performed and where necessary the new current necessary to null out the external field may be applied to the biasing strap. Thus it may be appreciated that the presence of the set-reset strap and the bias strap allows iterative measurement processes.

Applicant's invention provides an integrated magnetic field sensor of much reduced size, weight, power and cost as compared to any sensor that utilizes fields generated by external devices.

In accordance with the foregoing description, Applicants have developed a simple arrangement to set the direction of magnetization and to bias or calibrate magnetic field sensors. Applicant's arrangement is easily incorporated into the design of integrated magnetic field sensors. Although a specific embodiment of the Applicant's magnetization setting and biasing or calibrating arrangement is shown and described for illustrative purposes, a number of variations and modifications will be apparent to those of ordinary skill in the relevant arts. It is not intended that coverage be limited to the disclosed embodiment, but only by the terms of the following claims.

The embodiments of an invention in which an exclusive property or rights is claimed are defined as follows:

1. An integrated device for sensing external magnetic fields comprising:
   magnetic field sensing means having at least first and second magnetic field sensing elements and an output terminating region, said magnetic field sensing means being arranged to be sensitive to magnetic field components in a first direction and to provide an output signal at said output terminating region;
   means for setting a direction of magnetization in said first magnetic field sensing element in a second direction and for setting a direction of magnetization in said second magnetic field sensing element in a third direction with said magnetic field sensing means providing an output signal at a first level; and for reversing said directions of magnetization in said first and second magnetic field sensing elements with said magnetic field sensing means then providing an output signal at a second level with the difference between said first output signal at a first level and said second output signal at a second level being representative of said external magnetic field components in a first direction.

2. The integrated device of claim 1 wherein said first and second magnetic field sensing elements lie in a first plane and said means for setting and for reversing said directions of magnetization comprises a first electrical conductor means lying in a second plane spaced from said first plane, with said first conductor means adapted to conduct an electrical current in a direction whereby said direction of magnetization in said first magnetic field sensing element is set in a second direction and said direction of magnetization in said second magnetic sensing element is set in a third direction, and reversing said direction of said first current.

3. The integrated device of claim 2 wherein said first electrical conductor means is a metallic current strap.

4. The integrated device of claim 3 wherein said metallic current strap has a spiral form.

5. The integrated device of claim 2 wherein said integrated device is formed on a silicon substrate and said first electrical conductor means is an implant layer in said silicon substrate.

6. The integrated device of claim 2 wherein said integrated device is formed on a silicon substrate and said first electrical conductor means is said silicon substrate.

7. The integrated device of claim 2 wherein said integrated device is formed on a conducting substrate and said first electrical conductor means is said conducting substrate.

8. The integrated device of claim 2 further comprising a device package wherein said first electrical conductive means is a current strap located in said device package.

9. The integrated device of claim 2 wherein said direction of magnetization in said first magnetic field sensing element is opposite said direction of magnetization in said second magnetic field sensing element.

10. The integrated device of claim 1 further comprising means for producing a magnetic field in said first direction at said magnetic field sensing means.

11. The integrated device of claim 10 wherein said means for producing a magnetic field comprises a second electrical conductor means lying in a third plane spaced from said first plane, with said second electrical conductor means adapted to conduct a second electrical current in a direction perpendicular to said first direction.

12. The integrated device of claim 11 wherein said second electrical conductor means is in the form of a current strap parallel to said first direction.

13. The integrated device of claim 10 wherein said integrated device is formed on a substrate and said second electrical conductor means is an implant layer in said silicon substrate.

14. The integrated device of claim 10 wherein said integrated device is formed on a conducting substrate and said second electrical conductor means is said conducting substrate.

15. A device for sensing an external magnetic field in a first direction, comprising:
magnetic field sensing means having first, second, third, and fourth magnetoresistive elements, each of said magnetoresistive elements having first and second terminating regions, said first magnetoresistive element first terminating region being connected to said third magnetoresistive element first terminating region, said first magnetoresistive element second terminating region being connected to said second magnetoresistive element second terminating region, said third magnetoresistive element second terminating region being connected to said fourth magnetoresistive element second terminating region and said second magnetoresistive element first terminating region connected to said fourth magnetoresistive element first terminating region;
means for producing a magnetic field in said first direction at said magnetoresistive elements;
means for setting a second direction of magnetization in said first and third magnetic sensing elements and for setting a third direction of magnetization in said second and fourth magnetic sensing elements with said magnetic field sensing means providing an output signal at a first level, and for reversing said directions of magnetization in said first and third magnetic sensing elements and in said second and fourth magnetic sensing elements with said magnetic field sensing means then providing an output signal at a second level with the difference between said first output signal at a first level and said second output signal at a second level being representative of external magnetic field components in a first direction.

16. The device of claim 15 wherein said magnetoresistive elements lie in a first plane and said means for producing a magnetic field in said first direction comprises a first electrical conductor means lying in a second plane spaced from said first plane.

17. The device of claim 15 wherein said device is formed on a substrate and said first electrical conductor means is an implant layer in said substrate.

18. The device of claim 15 wherein said device is formed on a conducting substrate and said first electrical conductor means is said electrical substrate.

19. This device of claim 15 further comprising a device package wherein said first electrical conductor means is a current strap located in said device package.

20. The device of claim 15 further comprising a second device of claim 15 wherein said second device is located to sense an external magnetic field in a fourth direction and said fourth direction is perpendicular to said first direction, said device being useful in a compass application.

* * * * *